United States Patent
Bozso et al.

(10) Patent No.: US 6,337,287 B1
(45) Date of Patent: Jan. 8, 2002

(54) HIGH SPEED, HIGH BANDWIDTH, HIGH DENSITY NONVOLATILE MEMORY SYSTEM

(75) Inventors: Ferenc Miklos Bozso, Ridgefield; Philip George Emma, Danbury, both of CT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/442,354

(22) Filed: Nov. 17, 1999

Related U.S. Application Data

(62) Division of application No. 09/024,759, filed on Feb. 17, 1998, now Pat. No. 6,016,267.

(51) Int. Cl.[7] .......................................... H01L 21/3063
(52) U.S. Cl. ...................... 438/745; 438/750; 438/753; 438/754
(58) Field of Search ................................. 438/745, 750, 438/753, 754, 3, 5, 6; 257/295, 298, 300, 306

(56) References Cited

U.S. PATENT DOCUMENTS

| | | | | |
|---|---|---|---|---|
| 4,149,302 A | * | 4/1979 | Cook | 29/25.42 |
| 4,873,664 A | | 10/1989 | Eaton, Jr. | 365/145 |
| 5,024,964 A | | 6/1991 | Rohrer et al. | 237/47 |
| 5,036,490 A | | 7/1991 | Kajimura et al. | 365/151 |
| 5,132,934 A | | 7/1992 | Quate et al. | 365/126 |
| 5,289,408 A | | 2/1994 | Mimura et al. | 365/151 |
| 5,317,533 A | | 5/1994 | Quate et al. | 365/151 |
| 5,487,031 A | * | 1/1996 | Gnade et al. | 365/145 |
| 5,530,667 A | | 6/1996 | Omura et al. | 365/145 |
| 5,530,668 A | | 6/1996 | Chern et al. | 365/145 |
| 5,789,797 A | * | 8/1998 | Ikuta et al. | 257/533 |
| 6,004,825 A | * | 12/1999 | Seyyedy | 438/3 |
| 6,027,947 A | * | 2/2000 | Evans et al. | 438/3 |
| 6,133,637 A | * | 10/2000 | Hikita et al. | 257/777 |

FOREIGN PATENT DOCUMENTS

| | | |
|---|---|---|
| JP | 2140973 | 5/1990 |
| JP | 4208565 | 7/1992 |
| JP | 8147982 | 6/1996 |
| JP | 9128960 | 5/1997 |

OTHER PUBLICATIONS

J.F. Scott, "Ferroelectric memories", Physics World, 2/95, pp. 46–50*.

"Solid State Devices Add a Third Dimension to Increase Density" R&D Magazine, Jun. 1995, pp. 37–40*.

* cited by examiner

Primary Examiner—Felisa Hiteshew
Assistant Examiner—Lan Vinh
(74) Attorney, Agent, or Firm—F. Chau & Associates, LLP; Robert P. Tassinari, Jr.

(57) ABSTRACT

A nonvolatile memory system is described. The system includes ferroelectric memory cells each comprising a pair of metal plates and a ferroelectric material therebetween. Data are stored in the cells by applying an electric field corresponding to the desired data value across a given cell, thereby setting the polarity of the ferroelectric material to a given state. A datum is read from a cell by a mechanical force to the ferroelectric material and sensing charge induced on one of the cells.

20 Claims, 15 Drawing Sheets

HIGH SPEED, HIGH BANDWIDTH, HIGH DENSITY NONVOLATILE MEMORY SYSTEM

CROSS-REFERENCE TO RELATED APPLICATION

This application is a Divisional of U.S. application Ser. No. 09/024,759 filed on Feb. 17, 1998 now U.S. Pat. No. 6,016,267.

FIELD OF THE INVENTION

This invention generally relates to memory systems, and specifically uses ferroelectric films to create memory systems that are nonvolatile. The invention demonstrates impressive volumetric density, random access capability, and bandwidth and access times that far exceed what is possible with current rotating magnetic media.

BACKGROUND OF THE INVENTION

Ferroelectric materials, such as $BaTiO_3$ and $SrTiO_3$ are known to possess a low symmetry that allows them to be polarized by an electric field, as shown in FIG. 1a. As used herein, the term "ferroelectric material" refers to any material in which polarity can be permanently set by means of application of an electric field, and encompasses the specific materials enumerated above and any other materials having the described properties.

The polarization of ferroelectrics increases as the voltage across the film is increased. When the electric field passes a saturation-polarization threshold, the film remains permanently polarized in that direction, and will decay to a fixed remnant polarization some time after the voltage is removed. This phenomenon is shown in FIG. 1b.

Threshold voltage depends on the thickness of the film. For a typical 0.2 micron thin film, 3–5 Volts is quite ample to effect a change in polarization in either direction for most ferroelectric films.

FIG. 2 shows that there is a relationship between physical pressure on a polarized film 22 (where the direction of polarization is indicated by arrows 20), and induced voltage. When a polarized film is compressed, for example by a distance $\Delta Z$ as shown in FIG. 2, a small displacement current through the film is generated in the compressed film. This results in charge accumulating at the surfaces of the film (e.g., on metal plates) which is the manifestation of the voltage induced by the applied pressure. Whether the voltage is positive or negative depends on the polarity of the film.

This mechanism also works in reverse. Particularly, if a voltage is applied across a polarized film, the film expands or contracts depending on, the magnitude of the voltage, and whether the voltage is positive or negative with respect to polarization. This effect is characterized by the ferroelectric's piezoelectric coefficient, which is in the range of 200 pC/N for the typical kinds of ferroelectric films in use today.

SUMMARY OF THE INVENTION

It is an object of the invention to provide a memory cell in which the state of the cell can be determined by applying a mechanical force to the cell and reading an induced electrical charge therefrom.

It is another object of the present invention to provide a nonvolatile memory system using ferroelectric films having a first film used to store a polarization state, and a second film used to apply mechanical pressure to the first film for the purposes of sensing the stored polarization state.

It is another object of the invention to integrate the aforementioned films onto a silicon surface so that circuitry in the silicon can be used to store polarization states, and to sense polarization states.

It is another object of the invention to use the aforementioned circuitry to provide random access to the stored states in the aforementioned ferroelectric film.

It is another object of the invention to use the aforementioned integrated silicon structure, henceforth referred to as a chip, to provide a wide parallel output which effects a high output bandwidth.

It is another object of the invention to provide periodic outputs from this chip by vibrating the aforementioned second film at its natural resonant frequency so as to operate the chip efficiently.

It is another object of the invention to create a memory system using two chips that share the aforementioned resonating structure by stacking the chips face to face, one on top of the other.

It is another object of the invention to create a larger memory system using a plurality of aforementioned memory systems by stacking the aforementioned memory systems on top of each other to obtain a large volumetric density, and even wider bandwidth.

It is another object of this invention to create an even larger memory system from a plurality of aforementioned larger memory systems in parallel.

BRIEF DESCRIPTION OF THE DRAWING

The foregoing and other objects, aspects, and advantages will be better understood from the following detailed description of a preferred embodiment of the invention with reference to the drawings, in which:

FIG. 4 further shows that the cells and the film are integrated onto a silicon surface, and the plurality of cells share circuitry that can be used to store or sense a polarization state, where each cell is coupled to this common circuitry through a passgate, and therefore, each cell is individually selectable for storing or sensing by this common circuitry;

DETAILED DESCRIPTION OF A PREFERRED EMBODIMENT OF THE INVENTION

Figure 3:
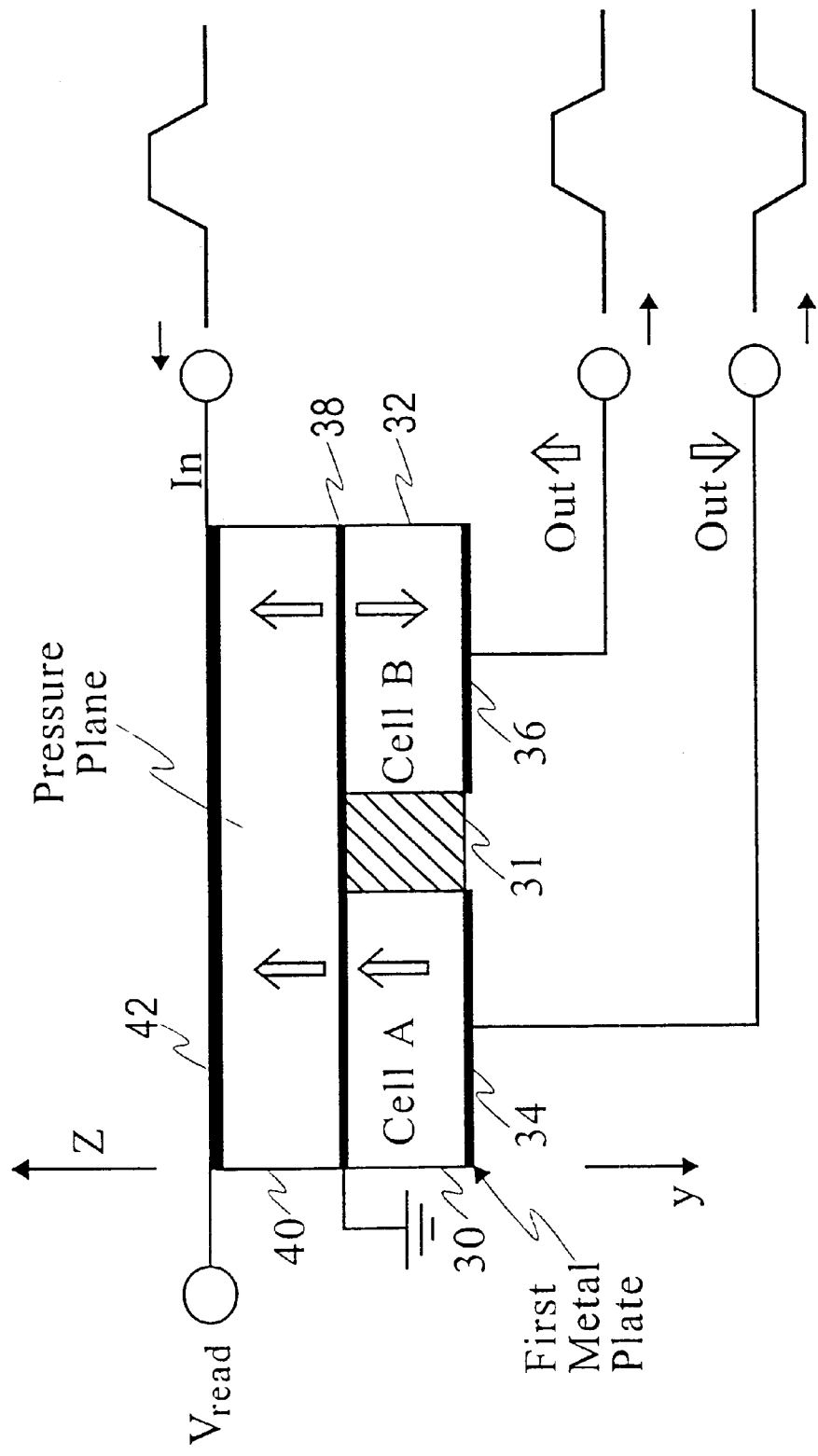
FIG. 3 shows a system comprising two adjacent cells made from a ferroelectric film, where the cells have opposite polarizations, and another ferroelectric film that is used to provide mechanical pressure to the pair in the manner depicted in FIG. 2, and it snows that the polarities of the voltages induced by the pressure mechanism correspond to the polarization polarities of each cell.

The invention will now be described in detail with respect to FIG. 3. The basic piezoelectric mechanism described above and its corresponding inverse mechanism can be used in tandem to sense, i.e., read, the polarization state of a ferroelectric film. FIG. 3 shows two cells, A and B, comprising respective ferroelectric films 30 and 32, and first metal plates 34 and 36 on the bottom surface of each cell.

Because, in the present embodiment, the ferroelectric films 30 and 32 are each part of a single contiguous layer, the area of each cell is defined by its respective first metal plate, since for instance, the area of the first film that is polarized is the local area directly over the first metal plate. Region 31 separates cells A and B, although in this embodiment, it is made from the same ferroelectric film and therefore forms part of a single layer with 30 and 32. It is crosshatched to indicate that it is not used in the same manner as the like material of films 30 and 32. For each cell, the first metal plate serves as the electrical output contact when the cell is sensed, and the electrical input contact when a new cell polarization state is written. The waveforms at the IN and OUT terminals of FIG. 3 illustrate the sensing process.

Both of the cells A and B in FIG. 3 have a surface attached to a second metal plate 38, which in the present embodiment is a single contiguous metal ground plane. A second polarized ferroelectric film 40 is disposed on the opposite surface of the metal plate 38, with film 40 having its other surface connected to a third metal plate 42.

Film 40 is sandwiched between the plates 38 and 42. This sandwich structure is mechanically constrained so that it can expand in the y direction, but not in the z direction, and the second ferroelectric film will therefore produce pressure when a voltage is applied to plate 42. This mechanical constraint is provided by placing the structure of FIG. 3 in a fixed-height package.

This resulting mechanical force will act on the pair of cells, inducing voltage thereacross which can be sensed at plates 34 and 36. The polarities of the induced voltage correspond to the local polarizations in films 30 and 32 directly above plates 34 and 36.

Figure 1B:
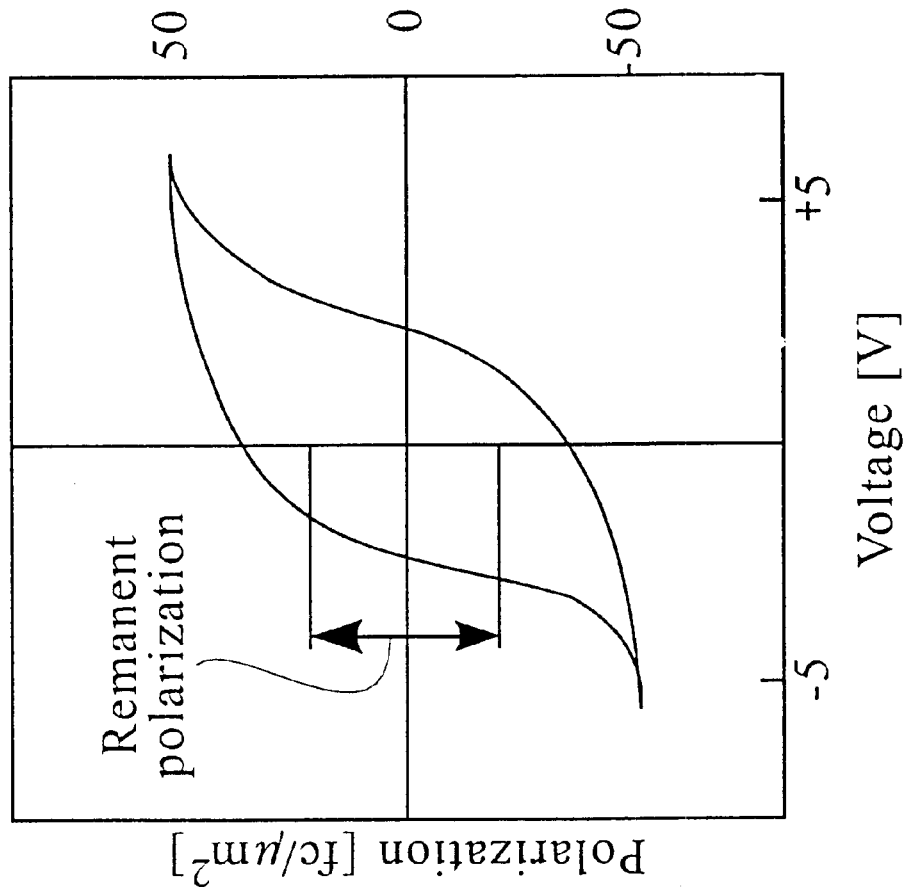
FIG. 1b shows a graph of the associated polarization hysteresis for the circuit of FIG. 1a as a function of an electric field applied across the film.
Figure 1A:
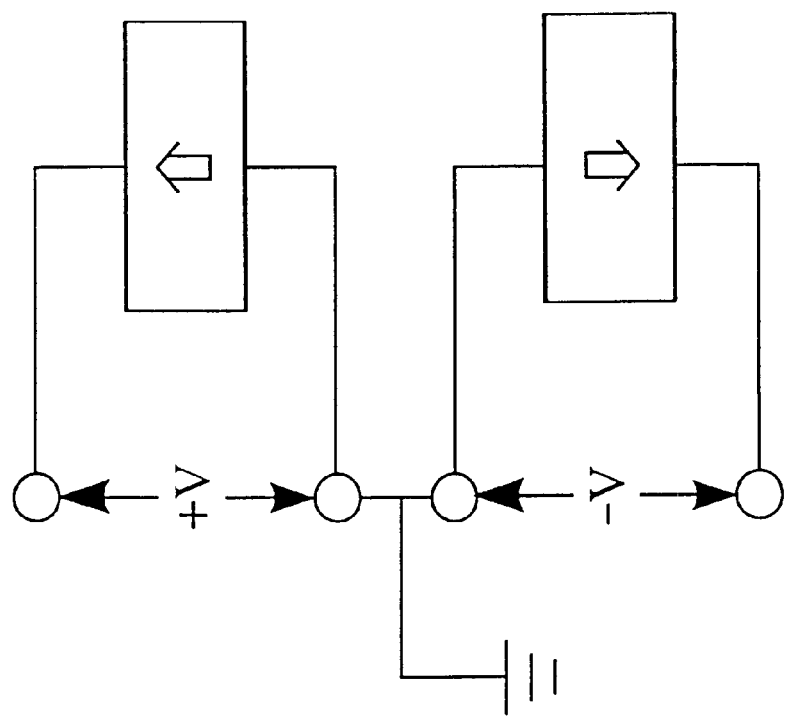
FIG. 1a shows two depictions of a ferroelectric film, each showing a different polarization.
Figure 2:
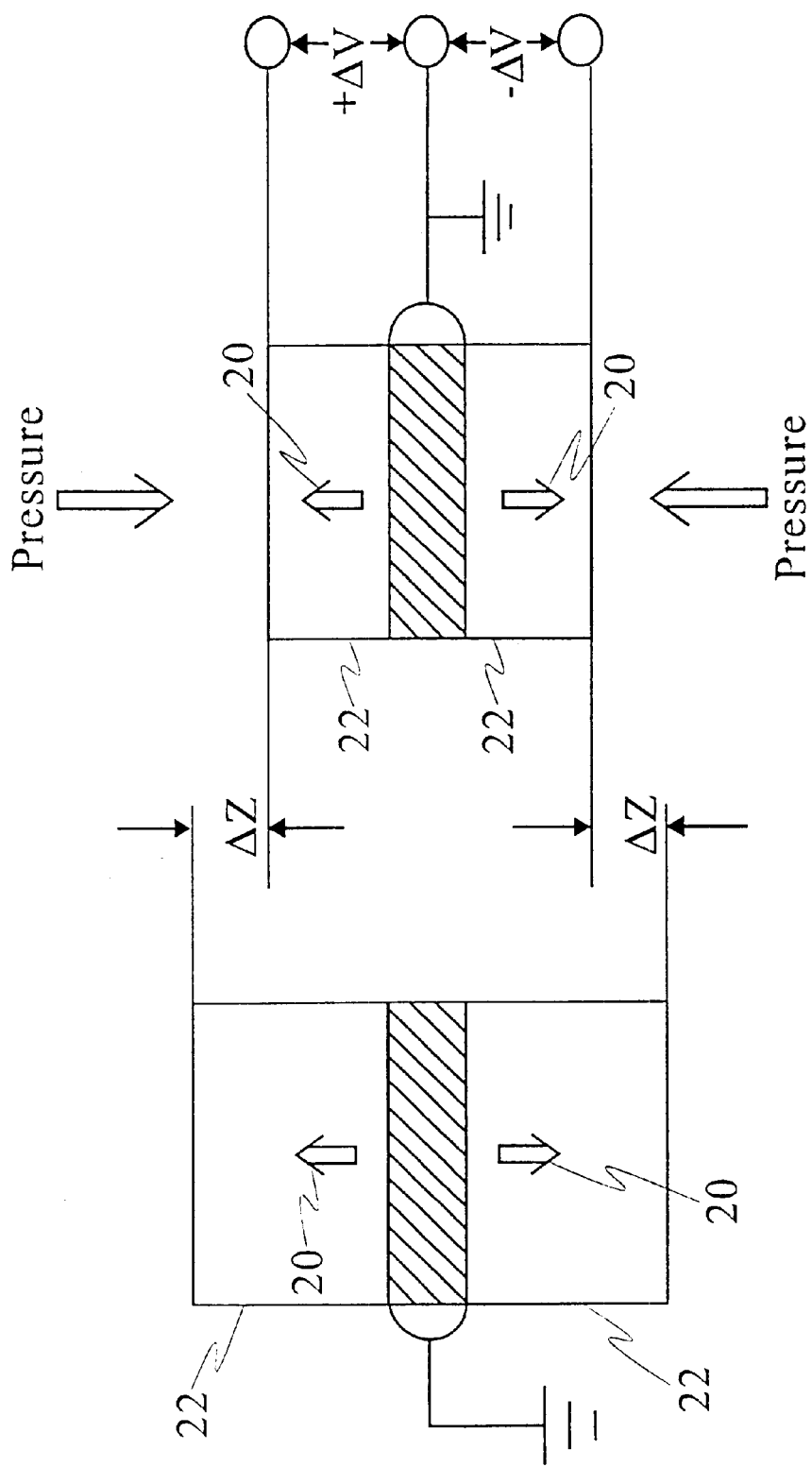
FIG. 2 shows two depictions of a ferroelectric film, each showing a different polarization, in which mechanical pressure on the film causes a voltage to be induced across the film, where the polarity of the resulting voltage corresponds to the polarization of the film.

Similarly, cells A and B can be written by applying positive or negative voltages to plates 34 and 36. The localized area in the film 30 and 32 over each plate will assume a polarization state corresponding to the polarity of the applied voltage, as was described with respect to FIG. 1.

As will be described, for reasonable values of all relevant parameters, the cells in FIG. 3 can be made very small (comparable to DRAM), very fast (comparable to SRAM), and can be made using simple processing techniques. Further, chips made of these cells can be made to provide high bandwidth when compared with known nonvolatile storage systems, and systems made of these chips can provide high capacity nonvolatile storage that has the latency of a DRAM main-memory system.

To illustrate the usefulness of such a cell, assume that the output of plate 34 in FIG. 3 must drive a load of 25 fF (including wire and the receiving circuit), and that the receiving circuit must sense 100 mV. To put a 0.100 mV potential on 25 fF requires 0.1×6E18×25E-15=1.5E4 electrons. A piezoelectric coefficient of 200 pC/N corresponds to 200 electrons per square micron atmospheres. Therefore, generating 1.5E4 electrons requires 75 square micron atmospheres with the coefficient of 200 pC/N. At a conservative pressure of 15 atmospheres, a cell of 5 square microns is sufficient.

Very conservatively, a 5 square micron cell (perhaps conservatively made slightly larger) surrounded by a modest border, and incorporating a sense amplifier, can easily be fit into a 20 square micron area. This gives an aerial density of 5 Mbits per square centimeter, which is roughly 4 MBytes per square inch.

Figure 4:
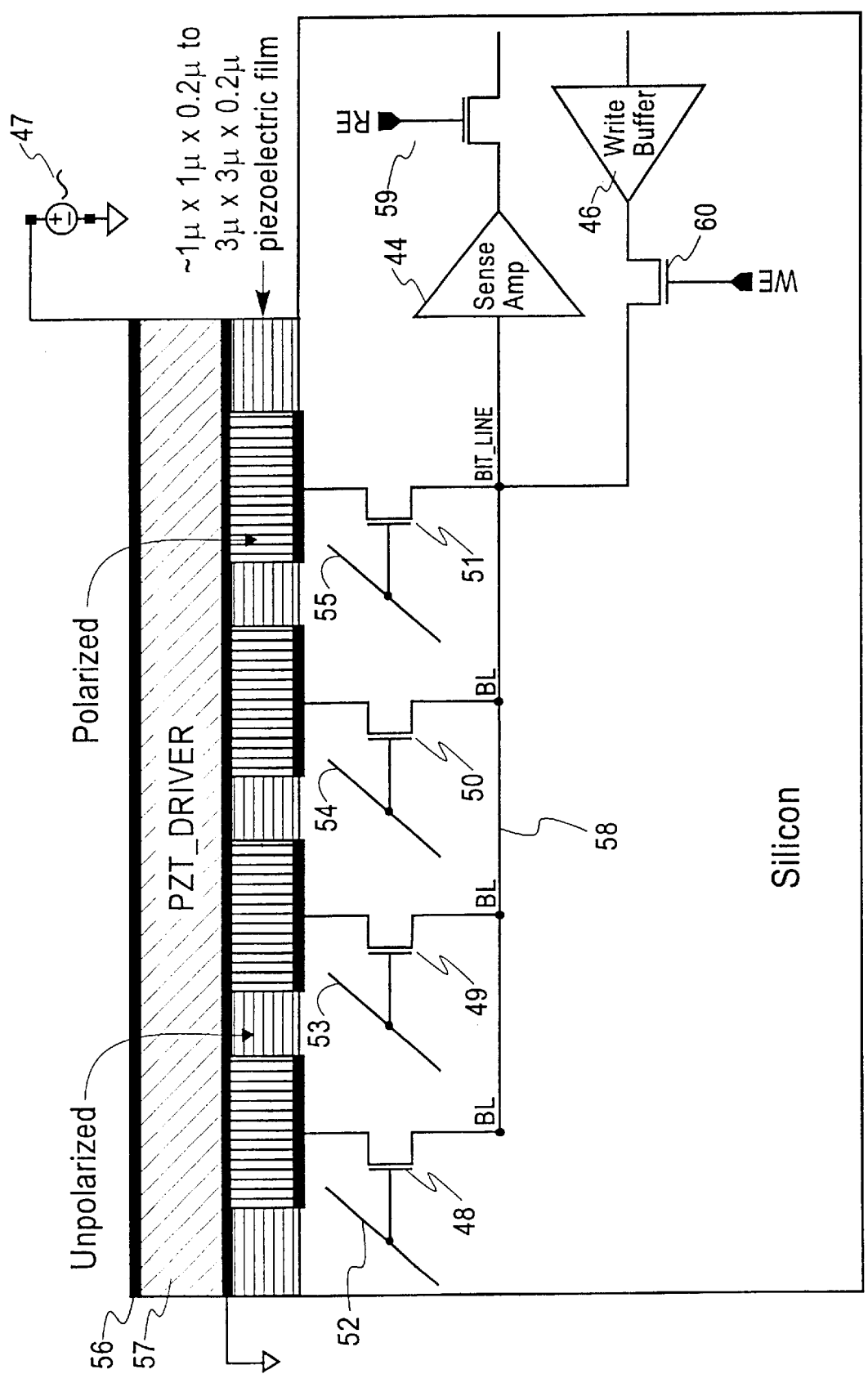
FIG. 4 shows a system comprising a plurality of adjacent ferroelectric cells, with a film on top of the plurality of cells that vibrates in response to an oscillating voltage applied across the second film.

FIG. 4 shows a plurality of storage cells, and circuitry for reading and writing the cells. The circuitry comprises a sense amplifier 44 for detecting the polarity of the voltage on the bit line, and a write buffer 46 for driving the bit line to a positive or negative voltage when the write enable (WE) signal is high. Each cell is coupled to the bit line through a respective passgate 48–51, and each passgate is controlled by a respective word line (WL) 52–55. Although an AC signal source is shown, it will be understood that either one of a pair of opposite-polarity DC voltage sources can be coupled to plate 56 by means of a switch actuated when a read is desired.

Thus, when a memory address is presented to the chip, decoding circuitry (not shown) operates on the address, and activates one of the word lines (WL). This connects one and only one of the cells of the structure of FIG. 4 to bit line 58. It will be understood that there can be many independent bit lines, on the chip.

If the desired operation is a read, then the read enable (RE) signal is raised at the gate of passgate 59, and when the oscillating voltage on the metal plate 56 goes high, film 57 will expand and thereby induce a positive or negative voltage on the bit line in accordance with the polarization state of the selected cell. The sense amp 44 senses the polarity of the voltage on the bit line 58, and drives the appropriate signal through passgate 59, and in the case of a multi-row array, to a chip-level multiplexor (not shown) which selects appropriate bit-line outputs.

If the desired operation is a write, then the write enable (WE) signal is raised at the gate of passgate 60, and the bit line 58 is driven to a positive or negative voltage (giving a 1 or a 0 depending on the value of data to be stored) by the write buffer. This voltage sets the polarization state of the selected cell.

In the numerical example above, a load capacitance of 25 fF was assumed. Note that the actual capacitance depends on the number of cells connected to a single bit line as well as the capacitance of each cell. A wide range of designs is possible, and in general, a chip will contain many bit lines. For example, in a 1 square-inch chip, if there were 32 cells per bit line, there would be one million bit lines.

Note that the total data bandwidth off the chip is determined by the product of the frequency at which the resonating plate 56 is driven and the number of I/O pins that were driven off chip (purely a matter of design choice). Most ferroelectric films have resonant frequencies in the 20 MHz to 50 MHz range, and 1000 I/O pins is very reasonable in today's packaging technology. If the one million bit lines in the example above were multiplexed down to one thousand signal outputs, and if the structure were resonated at 20 MHz, the data rate from a single chip would be 2.5 GBytes per second.

Assuming 2.0 $\mu^2$/cell, a 1 square-inch chip contains 4 MBytes, and a data rate of 2.5 GBytes per second would read the entire contents of such a chip in 1.6 milliseconds. Therefore, a memory system may contain many such chips if run at this data rate. For example, 625 such chips could sustain this rate for one second.

Note that the latency associated with such a system is equal to the reciprocal of the resonant frequency. At 20 MHz, the latency is 50 microseconds. Further, this system offers random access capability. Thus, the system of the present invention provides distinct advantage over other nonvolatile media such as disks: higher bandwidth, lower latency, and random access capability.

The memory system of the present invention can be packaged with many chips together to achieve high volumetric density, as described below.

Figure 5:
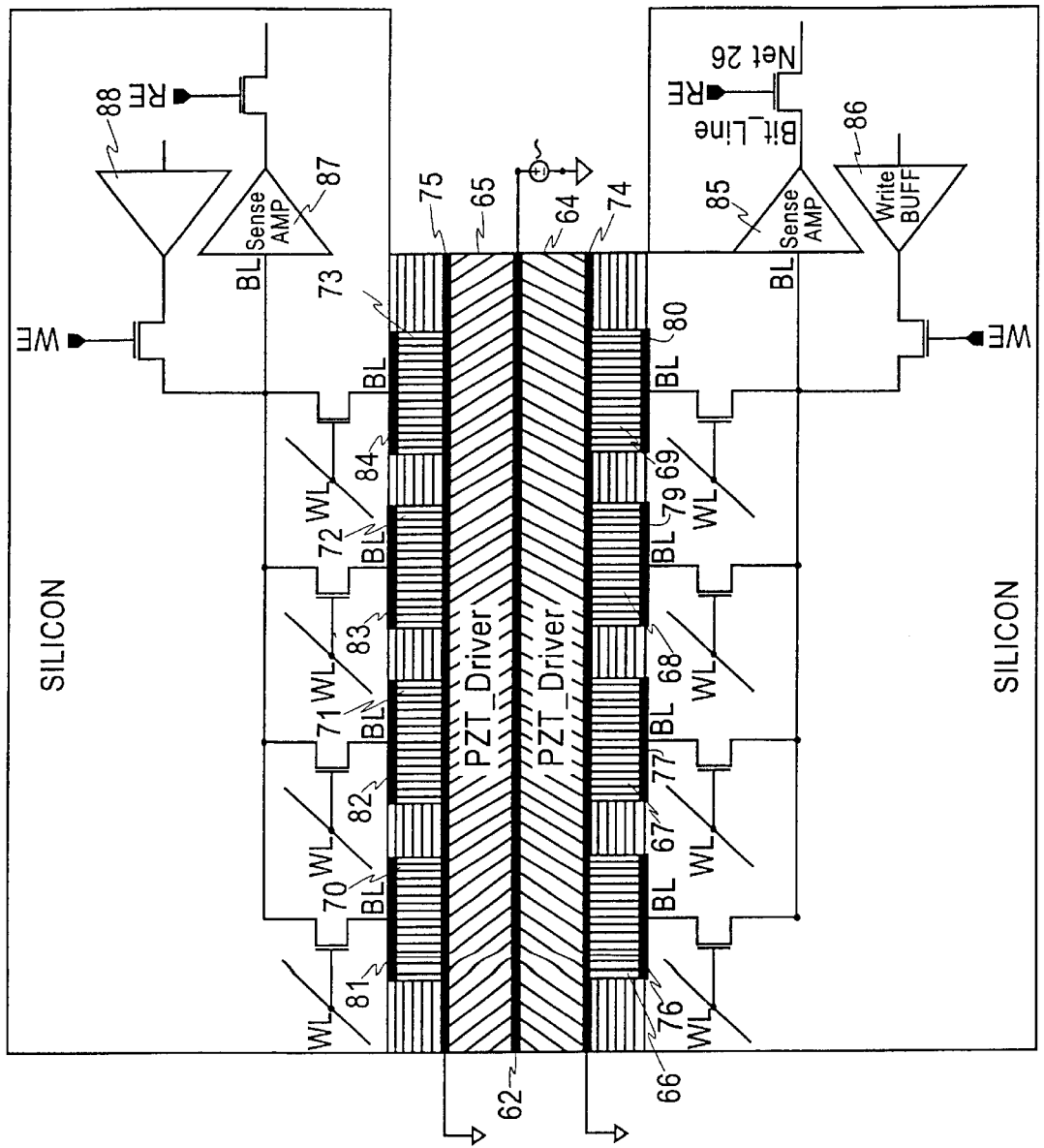
FIG. 5 shows two of the structures depicted in FIG. 4 coupled together face-to-face, one on top of the other, so that the pair of structures can share the voltage plate that induces mechanical vibration in each structure.

FIG. 5 shows a more complex memory arrangement in accordance with the invention. Specifically, two of the chips depicted in FIG. 4 can be combined into a single entity by placing the two chips together, face-to-face, so that a single resonating plate 62 is shared by the two chips. Each memory chip includes a ferroelectric film layer 64 and 65, respectively, and a plurality of memory cells comprising ferroelectric layers. 66–69 and 70–73. Layers 66–69 and 70–73 are separated from layers 64 and 65 by plates 74 and 75, respectively. Respective plates 76–84 provide a second boundary for layers 66–73, respectively. Cells 66–69 can be read/written via sense amp 85 and write buffer 86 in the manner described with respect to FIG. 4. Cells 70–73 can be read/written via sense amp 87 and write buffer 88 in similar fashion. The capacity of this structure is double the capacity of a single chip.

Figure 6:
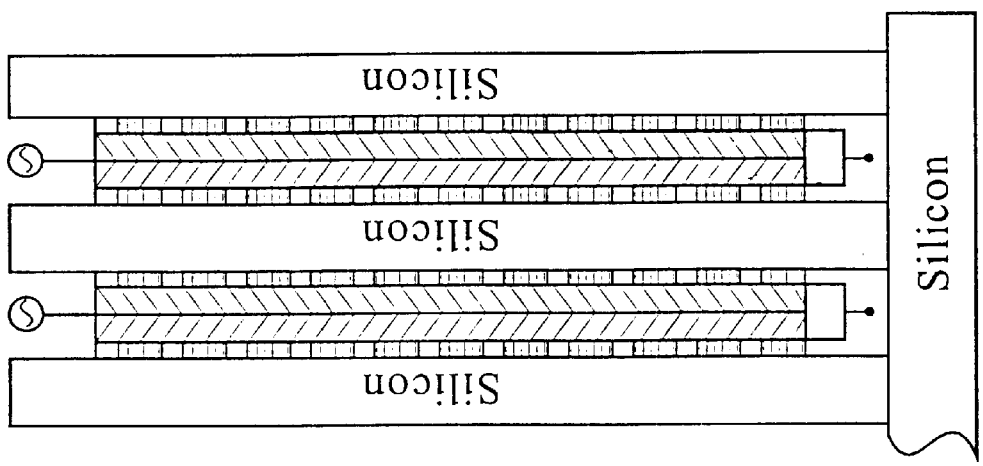
FIG. 6 shows a plurality of the structures depicted in FIG. 5 stacked up in a common stack to achieve high volumetric density.
Figure 6:
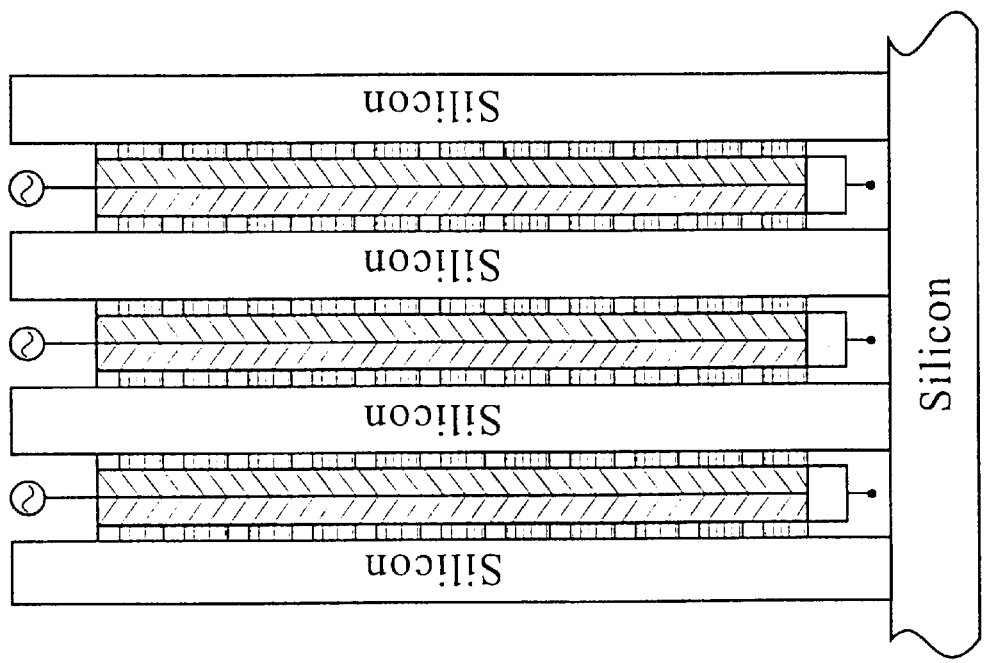
Figure 6:
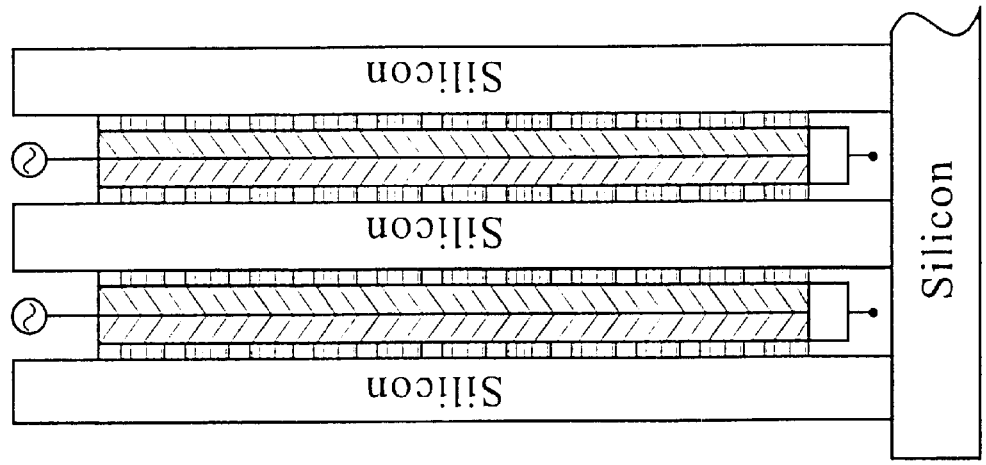

FIG. 6 shows a plurality of the structures in FIG. 5 stacked together into a tower configuration. Note that the thickness of current chips typically is in the 100 micron to 300 micron range, and chips can be ground to still thinner dimensions (e.g., 10 microns) at higher cost if need be. Therefore, a single chip as shown in FIG. 4, with two layers of ferroelectric film, can easily and economically be made at a thickness of 125 microns with no special machining or processing steps. Note that a one-inch thick stack of such chips comprises 200 chips, corresponding to a volumetric density of 800 MBytes per cubic inch. Note that if multiple such structures were packed into a box and run in parallel, a single cubic foot box would hold over one Terabyte of nonvolatile storage, even with 30% of the volumetric capacity left over for fans (if needed) and power supplies. This means that a 3 foot by 4 foot by 8 foot rack could contain 100 Terabytes, and 10 such racks could hold a Petabyte. This is equivalent to having an entire large database available on nonvolatile storage with DRAM-like latency to all parts of the database.

Further, each rack could easily provide a bandwidth corresponding to hundreds of pages per cycle at a 20 MHz to 50 MHz rate, even with only a single I/O pin per chip, and it could provide those pages with a latency in the range of 50 nanoseconds. The data rate is practically limited by the number of wires that could be run out of the rack. Certainly, one page per cycle is very easy to do.

Figure 14:
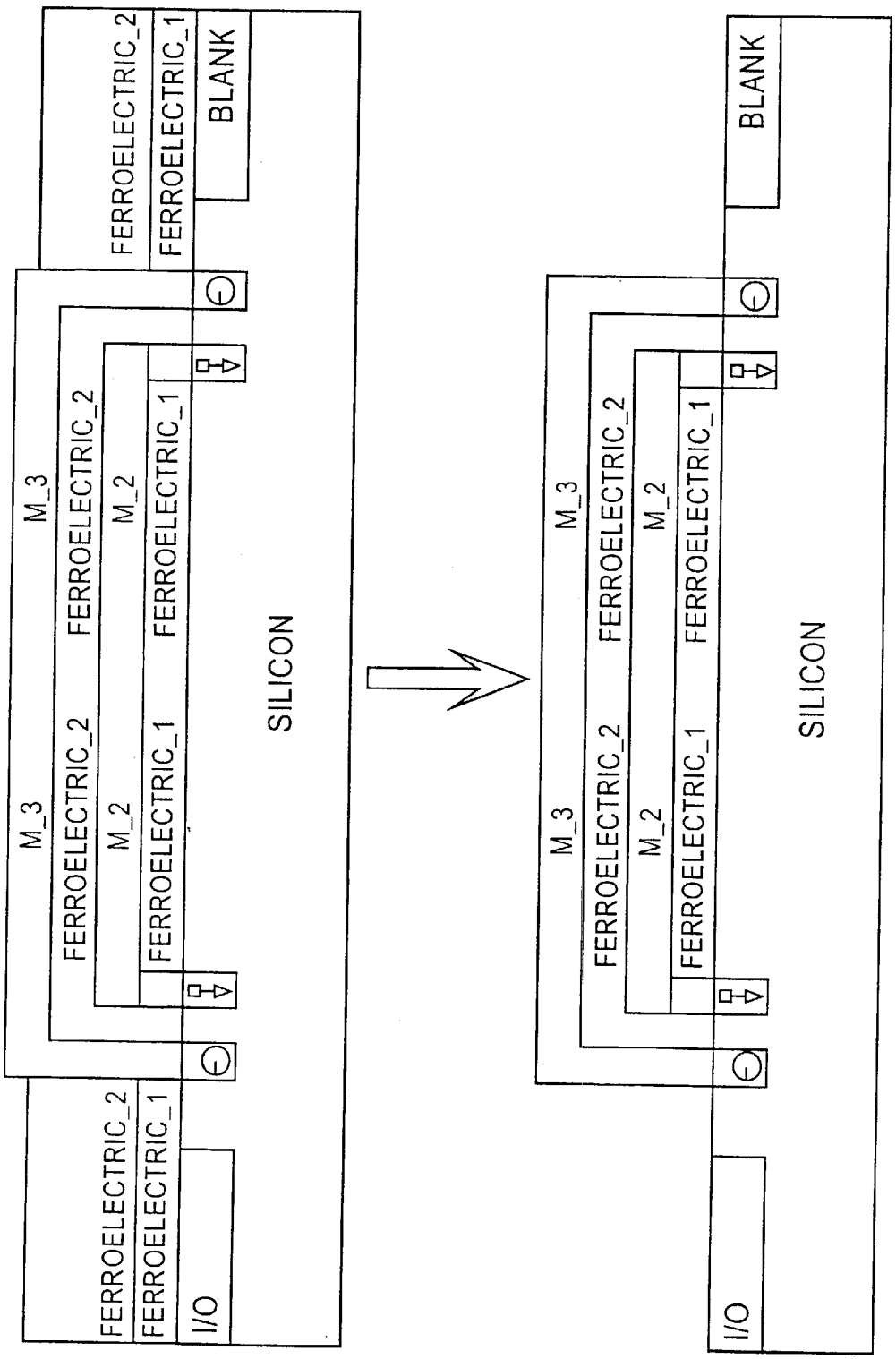
Figure 15:
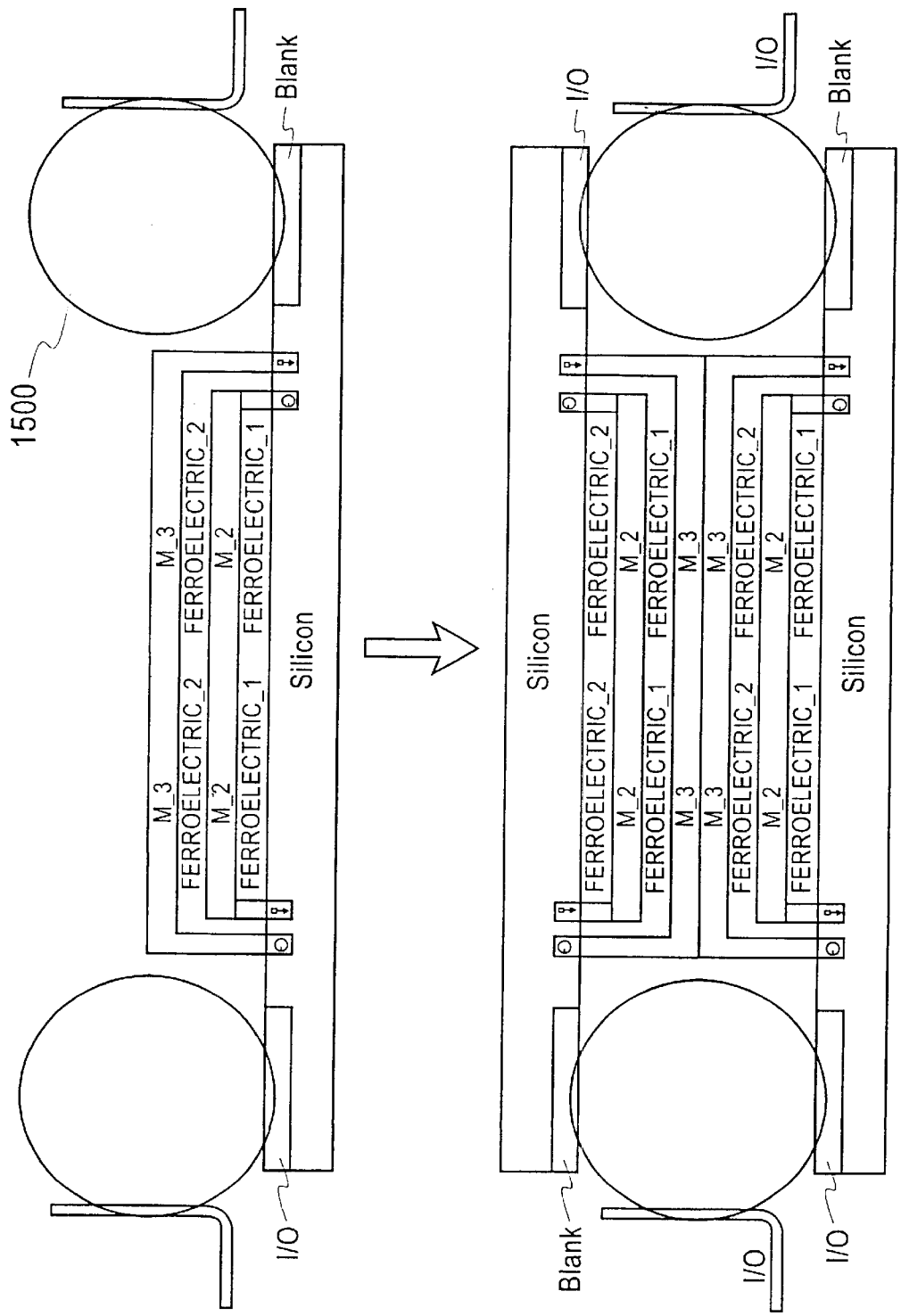

The processing steps associated with constructing a chip in accordance with the invention is now described with reference to FIGS. 7–15. FIGS. 7–13 are plan and side cross-sectional views of the chip in various stages of the process. FIGS. 14–15 are side cross-sectional views of further process stages.

Figure 7:
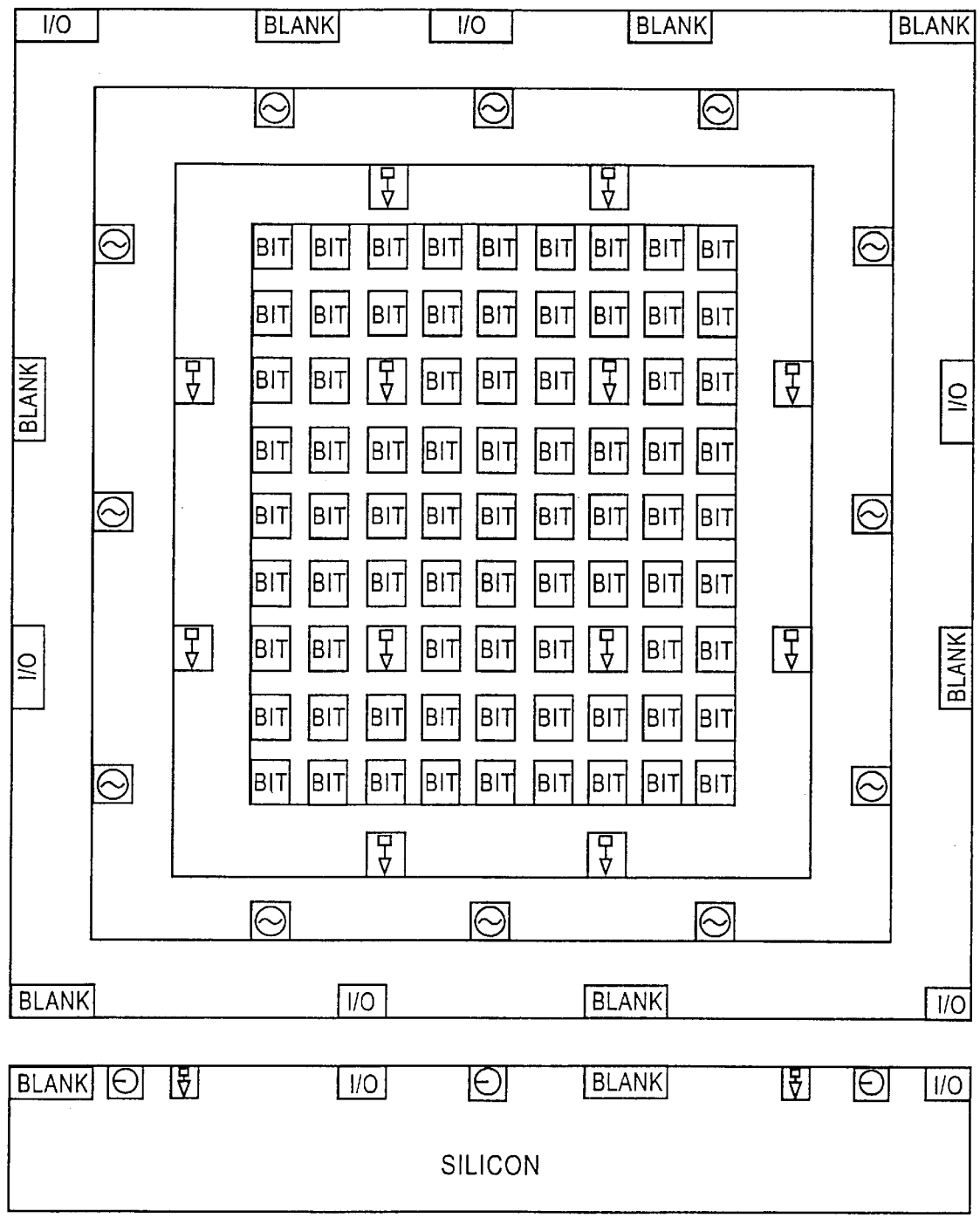
FIGS. 7–15 are sequential views of a process for constructing a chip in accordance with the invention.

The process begins following the construction of a memory chip, as shown in top and side cross-sectional views in FIG. 7. As shown, following the final processing step in the memory chip construction process, the surface of the chip is planarized SiO2 with properly placed and sized metal pads. Referring to the top view of FIG. 7, in an inner rectangular array, one pad serves for each bit (first metal plate). Ground pins are placed around the bit array, as indicated, and several ground pins can also be placed inside the bit array. The ground pins will be connected to the ground electrode of the first ferroelectric layer. AC pads, that will be connected to the second electrode of the first ferroelectric layer, are placed outside the ground pads, as shown.

I/O pads are placed along the perimeter of the chip. Next to each active I/O pad, there is a blank (floating) pad. These blank pads help to form flip-chip bonding between two chips and help to form wire bonds to the flip-chip-bonded devices. The composition of the metal pads (in many cases Pt/Ti alloy) is chosen to form proper electrode contact with the employed ferroelectric material and to be compatible with silicon technology.

Figure 8:
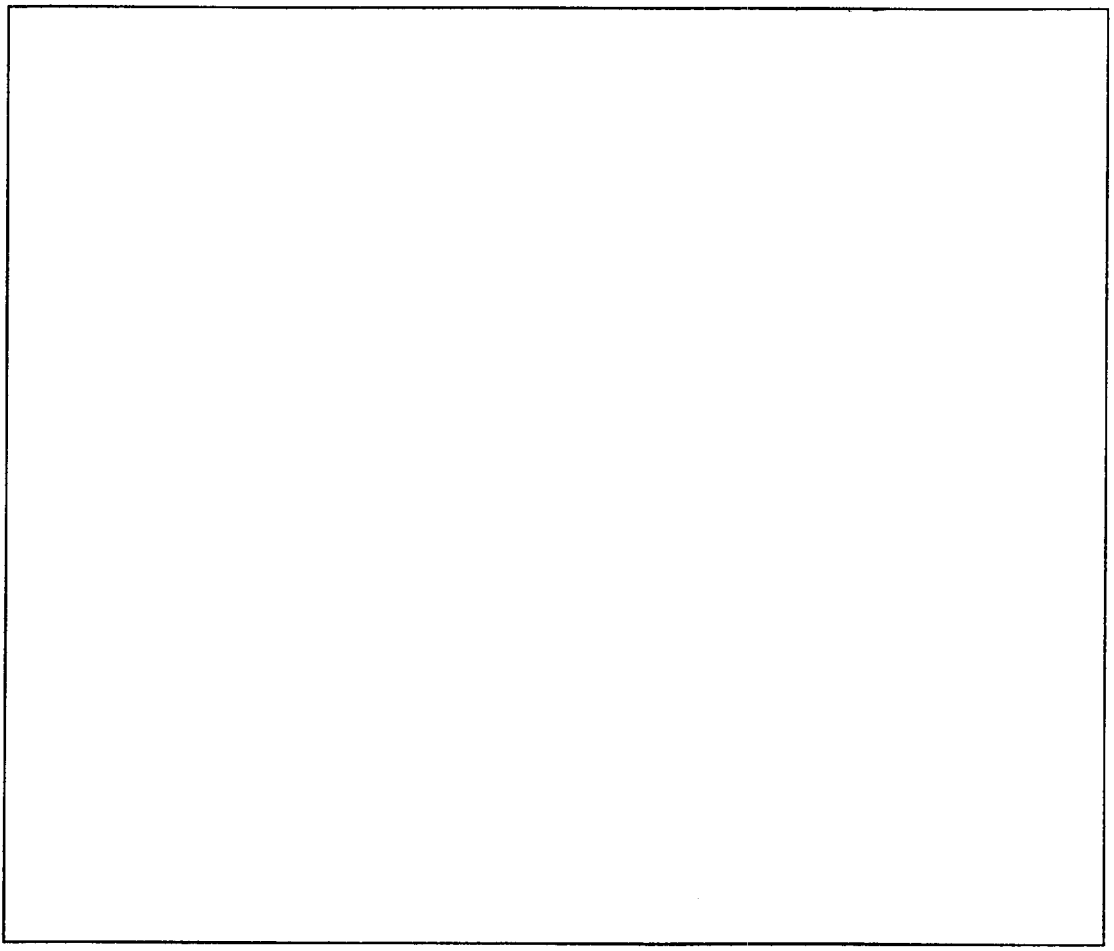
Figure 8:
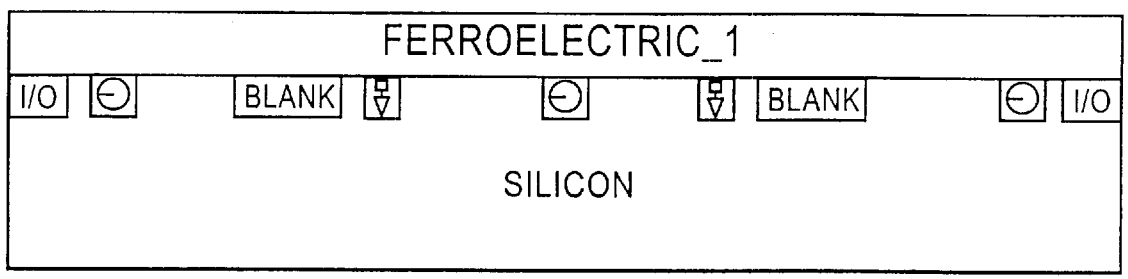

Referring now to FIG. 8, the next step of the process is to deposit a first ferroelectric layer of desired thickness on the planarized wafer surface, preferably by spin-coating. Other deposition techniques (Chemical or Physical Vapor Deposition etc.) may also be employed when certain deposition rate, deposition temperature, structure or type of ferroelectric film (like organic) is preferred. (See W. Wersing and R.Bruchhaus, SPIE Vol.2364, pp. 12, 1994). The thickness of the first ferroelectric layer is determined by the switching voltage intended to operate the device, and by the critical field (Ec), that is required for switching the polarization state of the employed ferroelectric material. In case of Ec=100 kV/cm and a switching voltage of 2.5 V, the thickness of the first ferroelectric film would be 0.000025 cm, i.e. 250 nm.

Figure 9:
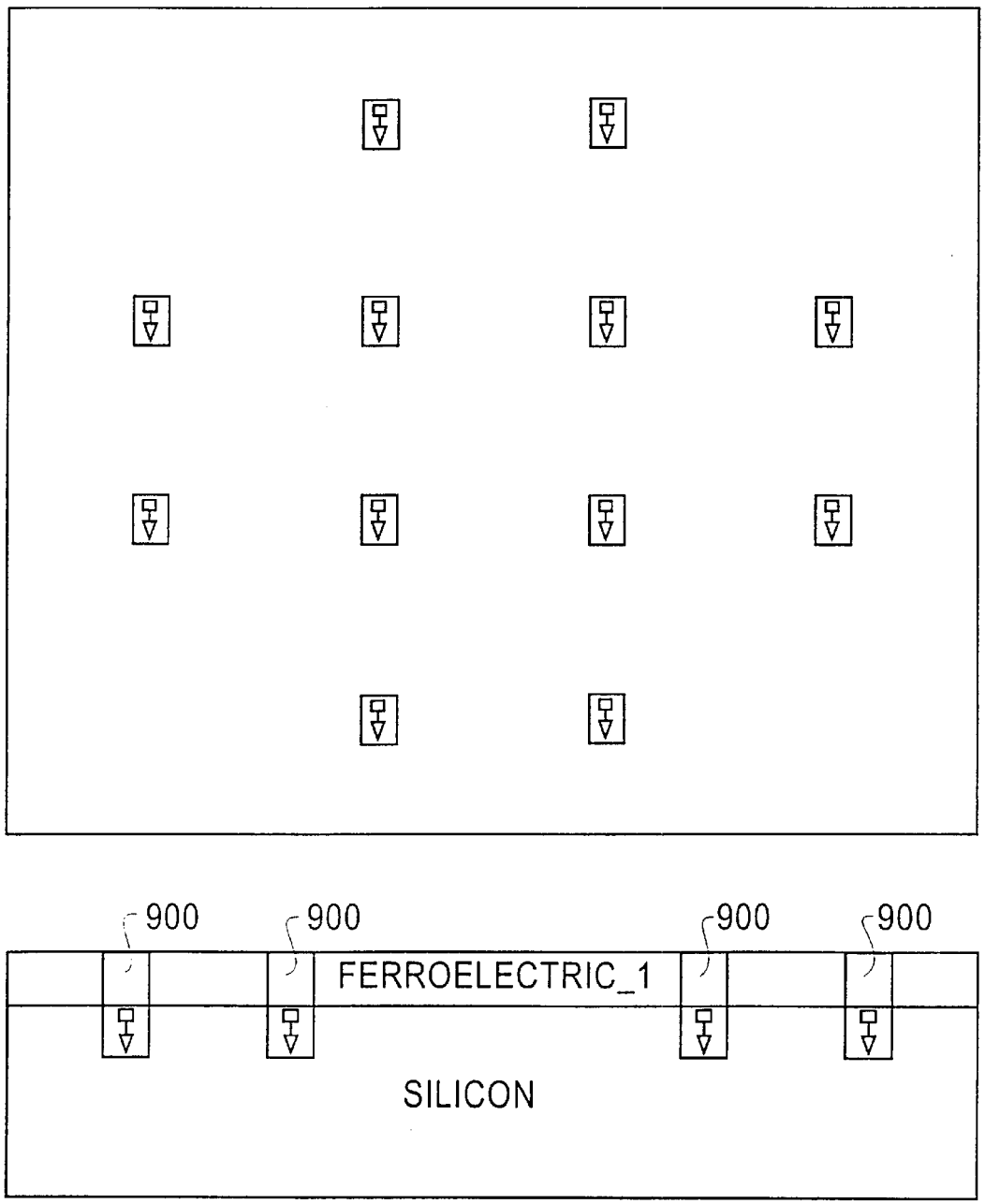

Referring now to FIG. 9, after deposition and initial annealing of the first ferroelectric layer, contact holes 900 are opened in a standard lithographic process over the position of the ground metal pads. The contact holes are preferably wet etched, using photomask, spun on the wafer.

Figure 10:
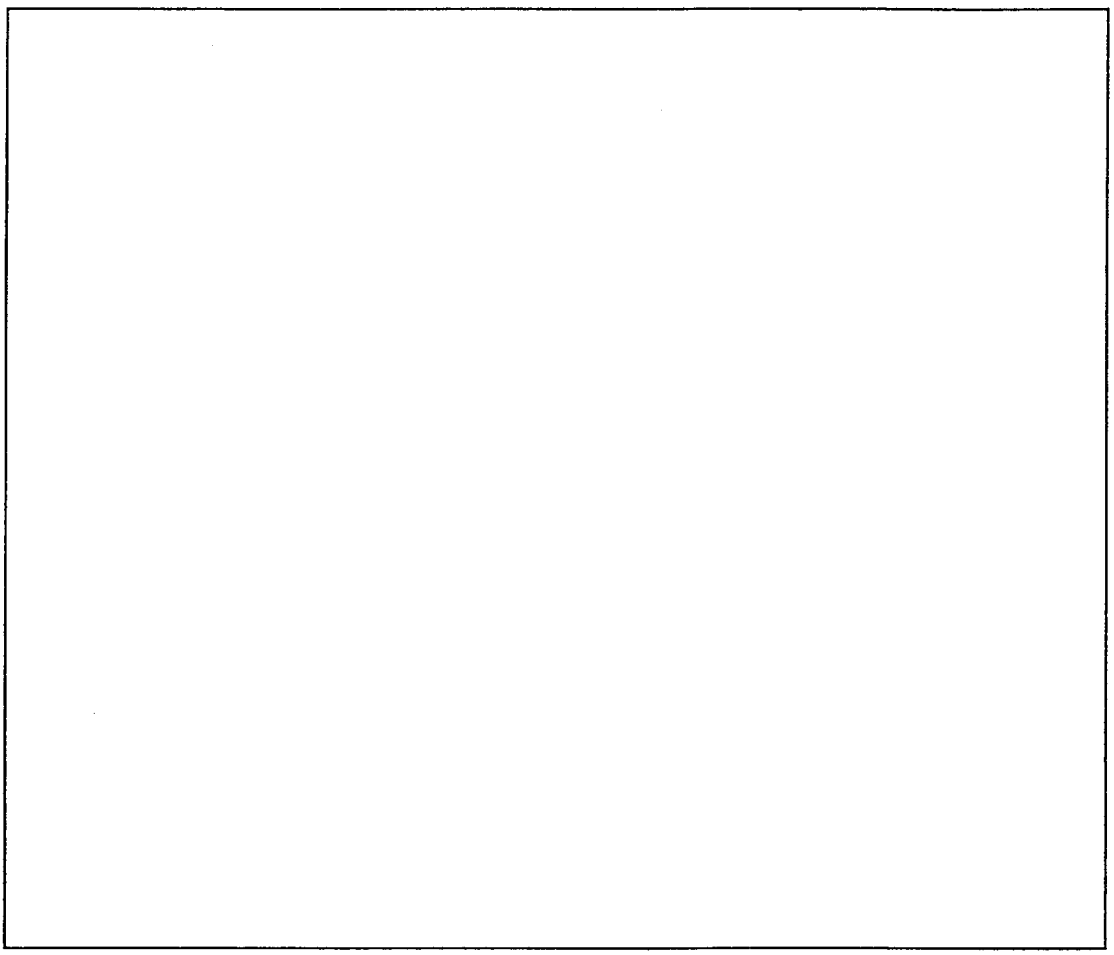
Figure 10:
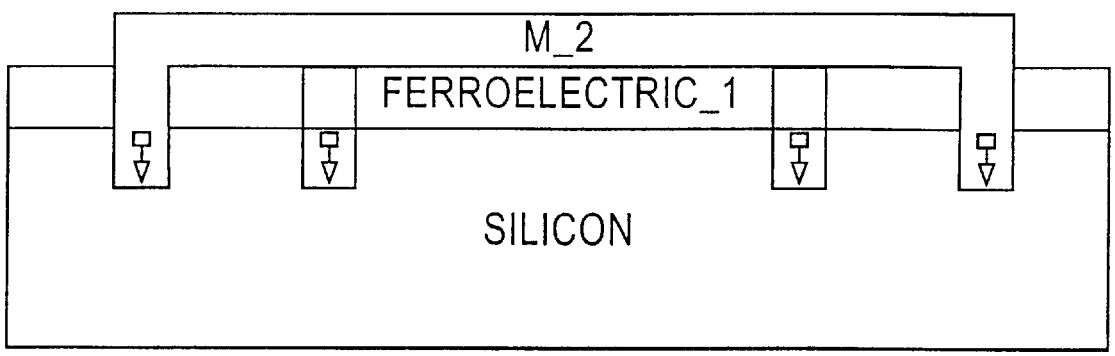

Referring to FIG. 10, a second metal electrode film (M_2) is now deposited on the first ferroelectric film in a rectangular shape, extending to the outer edge of the ground contact holes. In this process contact is made between the second metal layer on top of the first ferroelectric film and the first metal ground pads of the chip.

Figure 11:
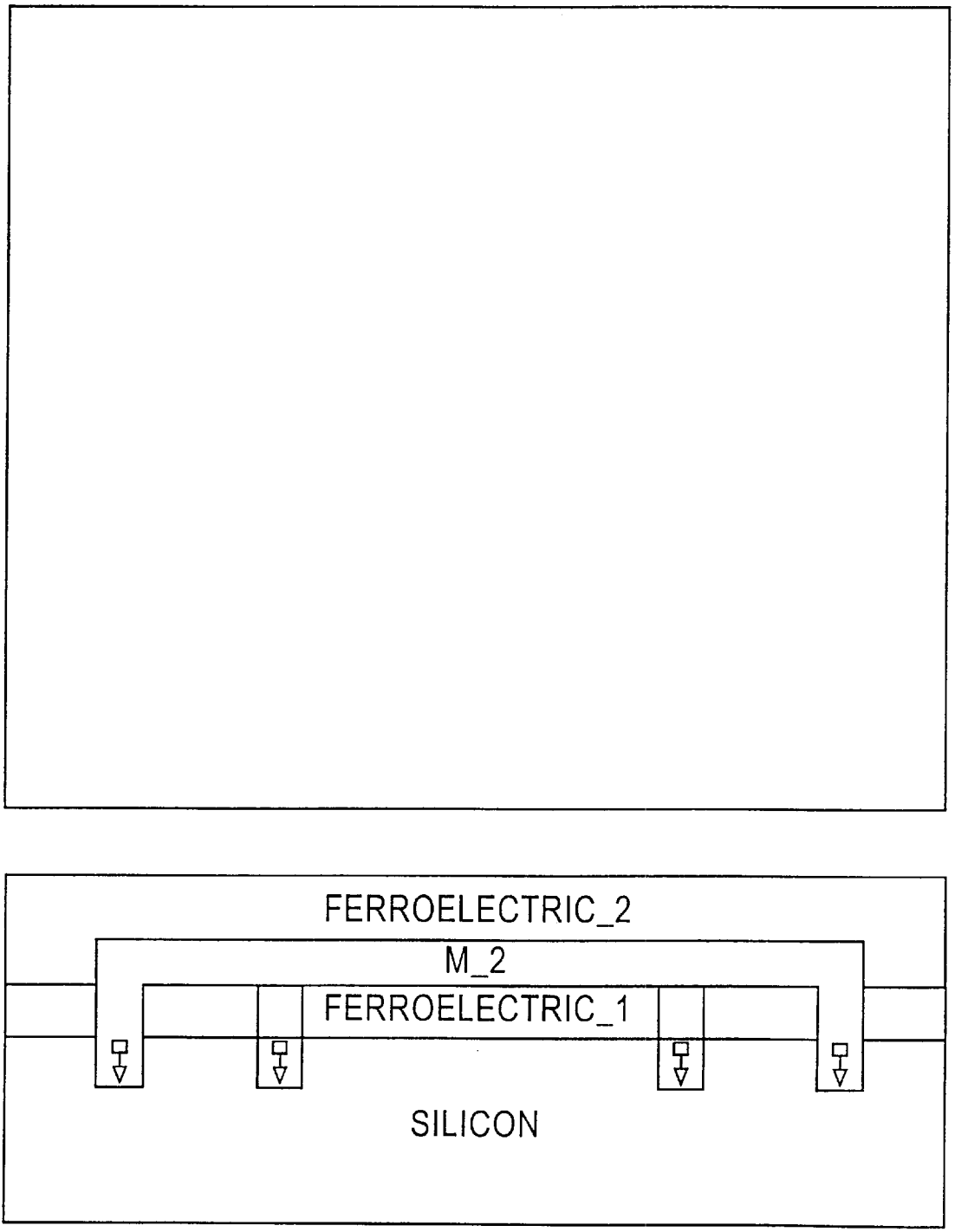

Referring to FIG. 11, a second layer of ferroelectric film is now deposited, covering the second metal layer (M2) and part of the first ferroelectric layer, that is extending beyond the M2-covered area. The thickness of the second ferroelectric film is tuned to provide proper and stable drive either at, or outside of resonance frequencies in a desired frequency range. The thickness of the second ferroelectric layer is expected to be several times that of the first ferroelectric layer. In that case the driving AC voltage (of the magnitude of the switching voltage) causes only small polarization modulation in the second ferroelectric film, which may result in more stable piezoelectric drive and lower power consumption. The deposition of the second ferroelectric layer is followed by a second thermal annealing step.

Figure 12:
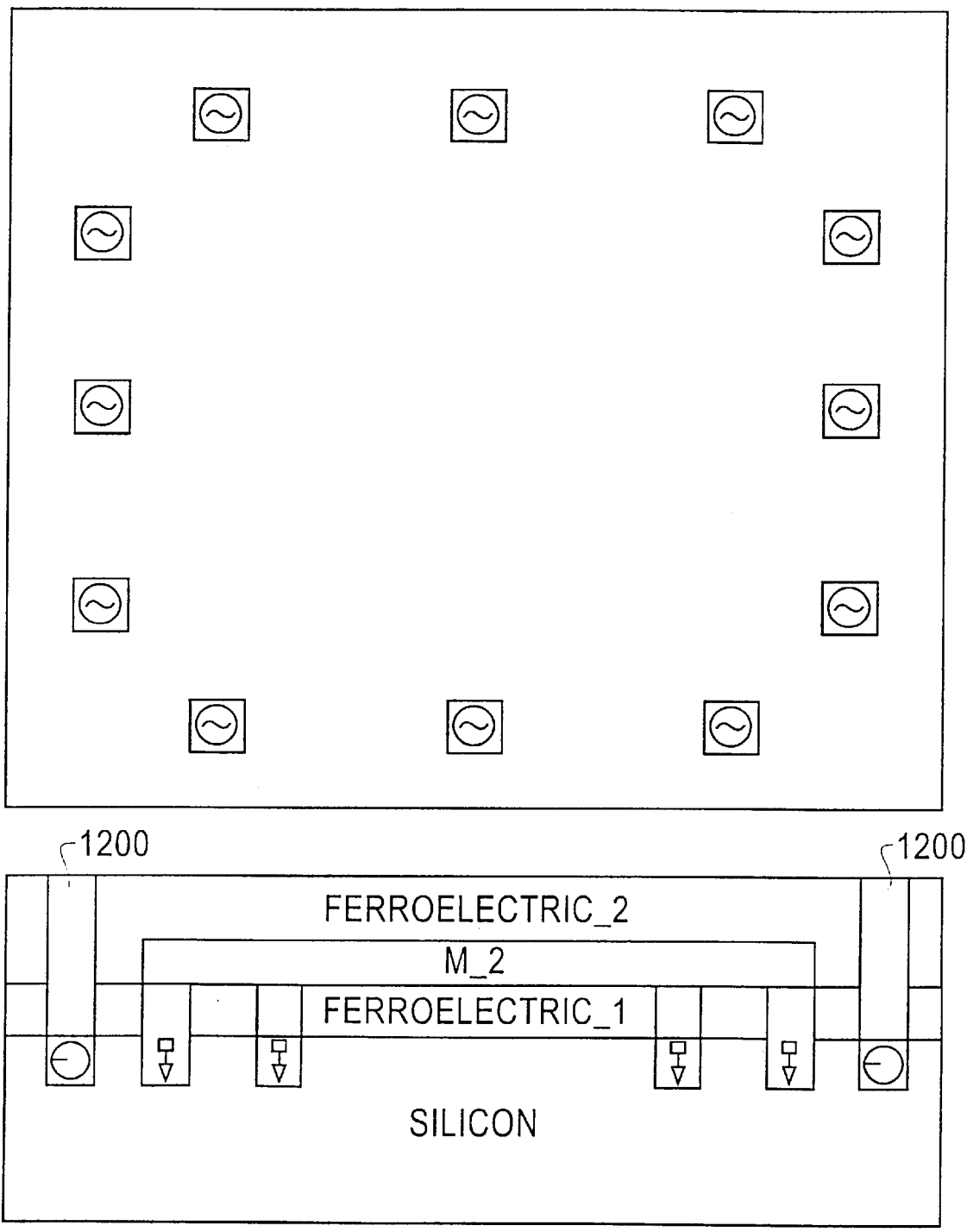

Referring to FIG. 12, contact holes 1200 are etched through the second and first ferroelectric layers at the corresponding AC pad locations. Through; and these vias, contact will be made between the AC pads and the second (driver) electrode of the second ferroelectric film.

Figure 13:
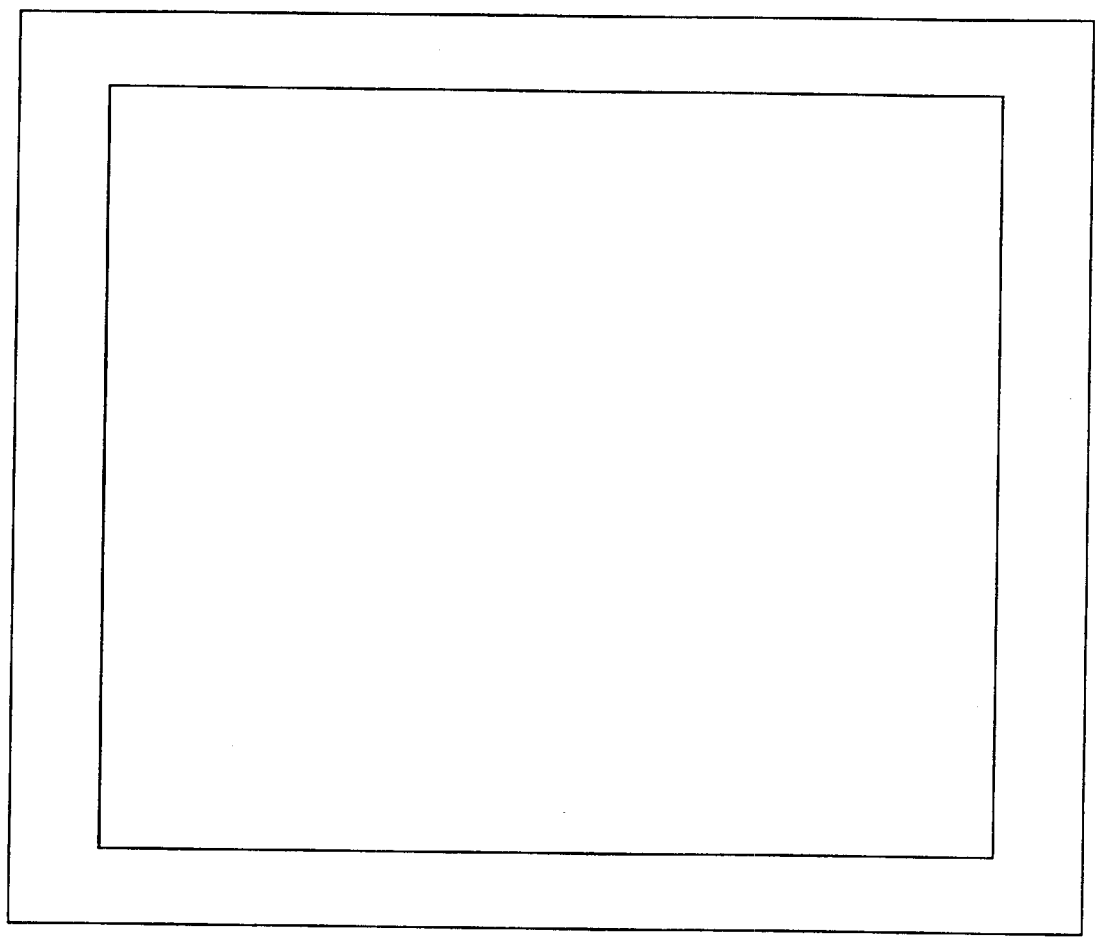
Figure 13:
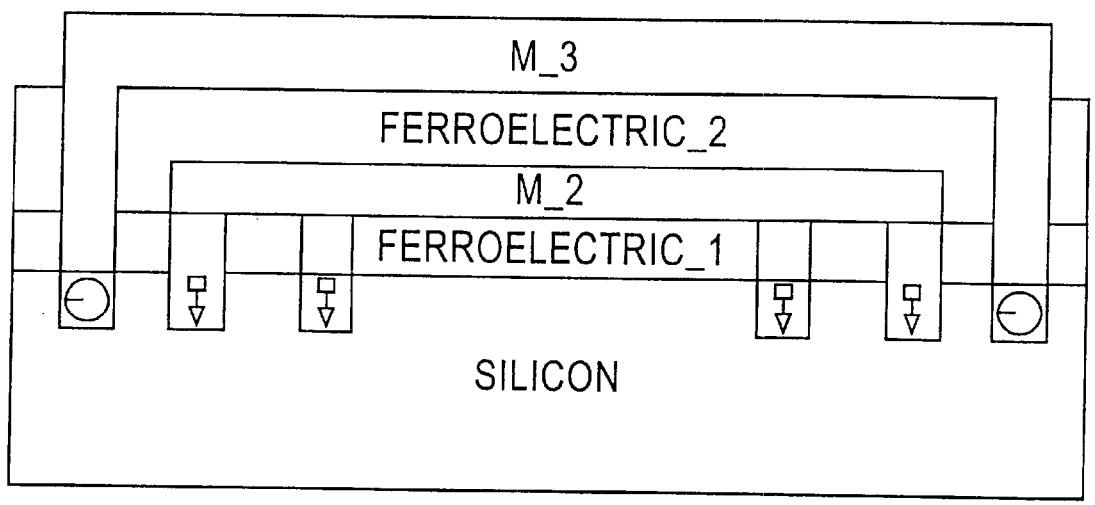

Referring to FIG. 13, a third layer of metal (M_3) is now deposited on top of the second ferroelectric film, covering an area extending to the outer edges of the AC pin vias.

Through the previously prepared vias, contact is made between the M3 third metal layer and the first metal AC drive pads.

Referring to FIG. 14, in the next processing step the area of the first and second ferroelectric layers extending beyond the boundary of the third metal layer is etched away. After this step, the first metal I/O and blank pads on the original chip are accessible again.

Referring to FIG. 15, in the next processing step solder-balls 1500 are attached to the first metal I/O and blank pads (along with smaller size solder-balls or solder film on the third metal film), and flip-chip-bonding is performed. Note that when two chips face each other for bonding, each active I/O pad faces a blank one and vice versa. At proper temperature the two chips are pushed together until the M3 layers get in touch and the chips fuse together.

Note that the described special flip-chip bonding technique, with active I/O pads bonded to blank pads on the opposite chip offers not only increased strength, but also easy wire-bonding sites and possibility for side mounted chip stacking.

While the invention has been described in particular with respect to preferred embodiments thereof, it will be understood that modifications to those embodiments can be effected without departing from the spirit and scope of the invention.

Having thus described our invention, what we claim as new, and desire to secure by Letters Patent is:

1. A method of manufacturing a nonvolatile memory system comprising the steps of:
    building an integrated circuit chip comprising a circuit to operate said nonvolatile memory system;
    patterning a plurality of first metal pads on the chip, each of said pads being connected to the circuit;
    depositing a first layer of ferroelectric film on top of the pattern of first metal pads;
    opening contact holes in the first ferroelectric film;
    depositing a second layer of metal on top of the first layer and forming contacts to the first metal pads through the contact holes;
    depositing a second layer of ferroelectric film on top of the second layer of metal;
    depositing a third layer of metal on top of the second layer of ferroelectric film and forming a contact to AC pads of the first metal pads; and
    etching away the second and first ferroelectric films extending beyond the boundary of the third metal film.

2. The method of claims 1, further comprising the steps of;
    flip-chip bonding pairs of chips constructed using the process of claim 1 with solder balls between active and blank I/O pads; and
    wire bonding for inter-chip and external connections.

3. The method of claim 1, wherein the circuit comprises sense amplifiers, write buffers, and multiplexing circuits.

4. A method of manufacturing a nonvolatile memory device, comprising the steps of:
    building an integrated circuit chip comprising a circuit for operating the nonvolatile memory device;
    forming, on a surface of the chip, a plurality of metal pads comprising ground pads and bit pads that are connected to the circuit;
    depositing a first layer of ferroelectric film over the surface of the chip;
    opening a first set of contact holes in the first layer of ferroelectric film to the ground pads; and
    depositing a first layer of metal on top of the first layer of ferroelectric film and forming contacts of the first layer of metal to the ground pads through the first set of contact holes.

5. The method of claim 4, wherein the integrated circuit chip comprises a plurality of sense amplifier and write buffer pairs, and wherein sets of bit pads are each operatively coupled to a corresponding one of the sense amplifier and write buffer pairs.

6. The method of claim 4, wherein the first layer of ferroelectric film has a thickness of about 250 nm.

7. The method of claim 4, wherein the plurality of metal pads further comprise voltage source pads, and wherein the method further comprises the steps of:
    depositing a second layer of ferroelectric film over the first layer of metal;
    depositing a second layer of metal over the second layer of ferroelectric film; and
    forming a contact between the second layer of metal and the voltage source pads.

8. The method of claim 7, wherein the second layer of ferroelectric film has a thickness that allows the second layer of ferroelectric film to vibrate at a resonant frequency that substantially corresponds a frequency of a voltage source connected to the voltage source pads.

9. The method of claim 7, wherein the plurality of metal pads further comprise blank pads and input/output (I/O) pads.

10. The method of claim 9, further comprising the step of flip-chip bonding a first memory device and a second memory device constructed in accordance with the method of claim 9.

11. The method of claim 10, wherein the step of flip-chip bonding comprises the steps of:
    attaching solder balls to the blank pads, I/O pads and the second layer of metal of the first memory device;
    orienting the first memory device and second memory device such that I/O pads and blank pads on the first memory device respectively face blank pads and I/O pads on the second memory device; and
    contacting the second layer of metal of the second memory device to the second layer of metal of the first memory device to fuse the first memory device and the second memory device to each other.

12. The method of claim 9, wherein the step of forming the plurality of metal pads comprises the steps of:
    patterning the bit pads in an array defining a first area on the surface of the integrated circuit chip;
    forming the ground pads in a second area surrounding the first area;
    forming the voltage source pads in a third area surrounding the second area; and
    forming the I/O pads and blank pads in a fourth area surrounding the third area.

13. The method of claim 12, wherein the array of bit pads is two-dimensional and wherein the first area defined by the array of bit pads, the second area, the third area and the fourth area are substantially rectangular in shape.

14. The method of claims 12, wherein the array of bit pads further comprises at least one ground pad.

15. The method of claim 12, wherein the first layer of ferroelectric film deposited over the surface of the chip extends to an outer boundary defined by the fourth area comprising the I/O pads and blank pads, wherein the first layer of metal deposited over the first layer of ferroelectric film extends to an outer boundary defined by the second area comprising the ground pads, wherein the second layer of ferroelectic film deposited over the first layer of metal extends to the outer boundary defined by the fourth area comprising the I/O and blank pads, and wherein the second layer of metal deposited over the second layer of ferroelectric film extends to an outer boundary defined by the third area comprising the source voltage pads.

16. The method of claim 15, wherein the step of forming a contact between the second layer of metal and the source voltage pads comprises the step of opening a second set of contact holes through the second and first layers of ferroelectric film to the voltage source pads prior to the step of depositing the second layer of metal over the second layer of ferroelectric film.

17. The method of claim 15, further comprising the step of etching away the second and first layers of ferroelectric film extending beyond the boundary of the second metal layer to expose the blank and I/O pads.

18. A method of manufacturing a nonvolatile memory array for an integrated circuit chip that operates the memory array, comprising the steps of:

forming a plurality of metal pads on a surface of the chip, the first metal pads comprising an array of bit pads that are connected to the integrated circuit in a first area on the surface of the chip, a plurality of ground pads on a second area surrounding the first area on the surface of the chip, a plurality of voltage source pads on a third area surrounding the second area on the surface of the chip and a plurality of pairs of blank pads and input/output (I/O) pads on a fourth area surrounding the third area on the surface of the chip;

depositing a first layer of ferroelectric film over the surface of the chip;

opening a first set of contact holes in the first layer of ferroelectric film to the ground pads;

depositing a first layer of metal on top of the first layer of ferroelectric film and forming contacts of the first layer of metal to the ground pads through the first set of contact holes, the first layer of metal covering an area extending to the outer boundary defined by the outer edge of the first set of contact holes;

depositing a second layer of ferroelectric film over the first layer of metal and a portion of the first layer of ferroelectric film extending beyond the first layer of metal;

opening a second set of contact holes through the second and first layers of ferroelectric film to the voltage source pads;

depositing a second layer of metal over the second layer of ferroelectric film and forming a contact between the second layer of metal and the voltage source pads, the second layer of metal covering an area extending to the outer boundary defined by the outer edge of the second set of contact holes; and removing the first and second layers of ferroelectric film extending beyond a boundary of the second layer of metal to expose the plurality of pairs of blank and I/O pads.

19. The method of claim 18, wherein the array of bit pads is substantially rectangular in shape.

20. The method of claim 18, wherein the second layer of ferroelectric film has a thickness that allows the second layer of ferroelectric film to vibrate at a resonant frequency that substantially corresponds a frequency of a voltage source connected to the voltage source pads.

\* \* \* \* \*